United States Patent [19]

Bhatia et al.

[11] Patent Number: 4,743,781

[45] Date of Patent: May 10, 1988

[54] DOTTING CIRCUIT WITH INHIBIT FUNCTION

[75] Inventors: Harsaran S. Bhatia, Hopewell Junction, N.Y.; Harry J. Jones, Austin, Tex.; Shashi D. Malaviya, Hopewell Junction, N.Y.

[73] Assignee: International Business Machines Corporation, Armonk, N.Y.

[21] Appl. No.: 882,058

[22] Filed: Jul. 3, 1986

[51] Int. Cl.[4] .............. H03K 19/013; H03K 19/086; H03K 17/04; H03K 17/60

[52] U.S. Cl. .................................. 307/455; 307/355; 307/299.1

[58] Field of Search ............... 307/443, 445, 454, 455, 307/480, 481, 355, 356, 357, 573-575, 577, 583, 280, 300, 299 A

[56] References Cited

U.S. PATENT DOCUMENTS

| | | | |
|---|---|---|---|
| 4,251,737 | 2/1981 | Gaudenzi | 307/209 |
| 4,311,925 | 1/1982 | Chang et al. | 307/455 |
| 4,463,439 | 7/1984 | Weinberger | 364/784 |
| 4,486,880 | 12/1984 | Jeffrey et al. | 370/112 |
| 4,546,271 | 10/1985 | Barre | 307/443 |
| 4,580,066 | 4/1986 | Berndt | 307/276 |
| 4,608,667 | 8/1986 | Barry | 307/455 X |
| 4,617,475 | 10/1986 | Reinschmidt | 307/455 X |
| 4,628,216 | 12/1986 | Mazumder | 307/455 |

Primary Examiner—Stanley D. Miller
Assistant Examiner—David Bertelson
Attorney, Agent, or Firm—William T. Ellis

[57] ABSTRACT

A new dotting circuit for integrated circuit chips which provides line switching, as well as simultaneous true and complementary outputs, while eliminating the need for the standard collector circuit voltage clamp. This circuit is implemented by the collector dotting of two or more input transistors, the collector dotting of their respective reference transistors, the emitter dotting of one input transistor and a reference transistor to a constant current source, the emitter dotting of the other input transistor and the other reference transistor to a different constant current source, and an inhibit circuit for permitting current to flow to only one of the emitter-dotted circuits in accordance with a logic control signal.

19 Claims, 1 Drawing Sheet

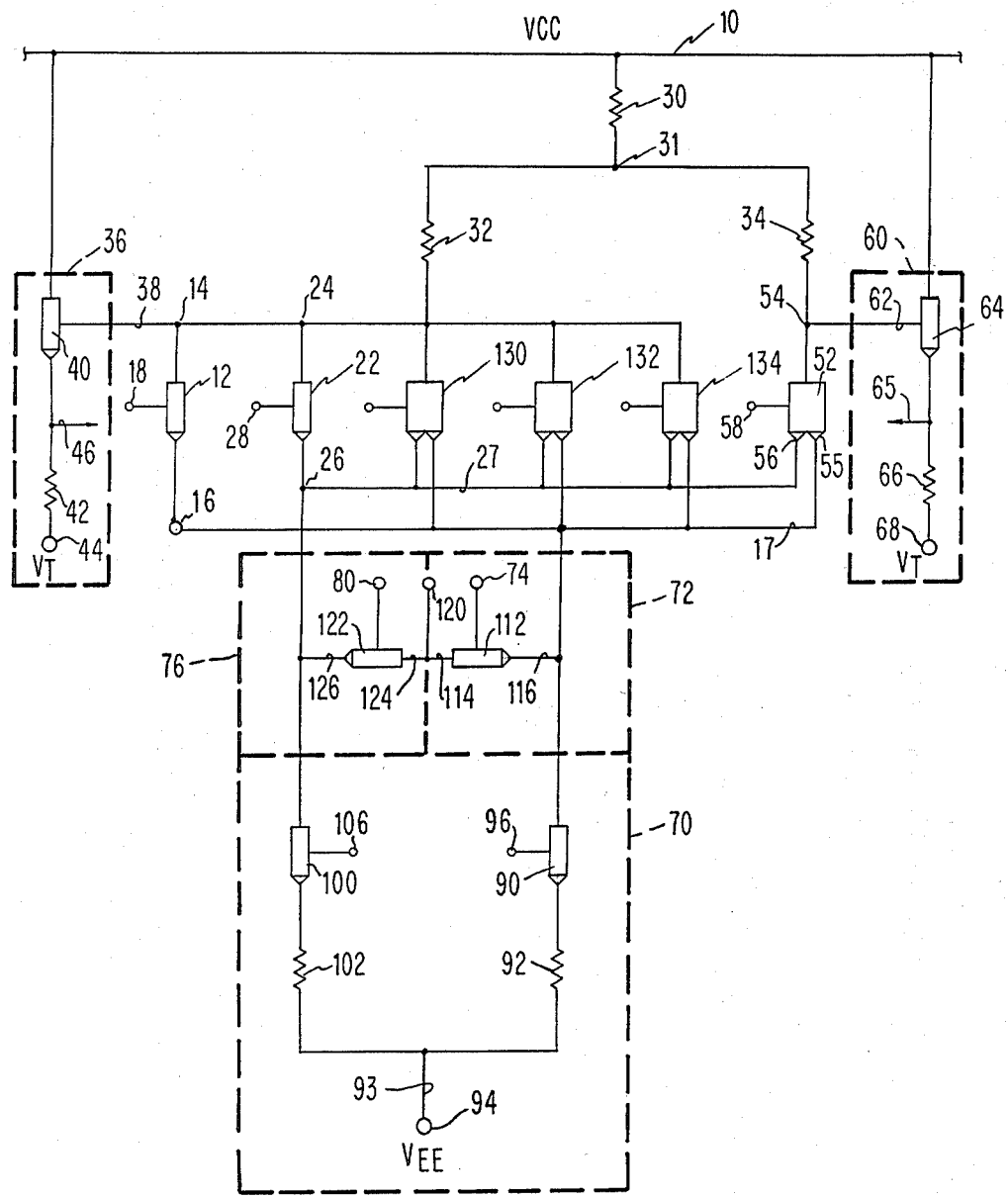

DOTTING CIRCUIT WITH INHIBIT FUNCTION

BACKGROUND OF THE INVENTION

The present invention relates generally to dotting circuits, and more particularly, to a new dotting circuit with an inhibit function for use in electronic engineering change EC circuits and decoder circuits.

There are currently a number of applications which require dotting of two input transistors along with a switching function for switching one of the dotted input transistors into a line while inhibiting the other. One such application is in the context of an electronic engineering change (EC) circuit design for an integrated circuit chip. In order to implement such an electronic EC circuit, a receiver circuit is designed with a first input transistor switch connected to an input/output (I/O) pin whrch is connected to buried wiring in a chip module. This buried wiring could connect, for example, to an I/O of another chip on the module. The EC circuit further includes a second transistor input switch which is connected to an EC pad disposed on the module external to the chip. This EC pad can be used as a land to provide a surface wire connection on the module from this chip to, for example, a different chip to thereby facilitate engineering changes. The signal from only one of these two input transistor switches is to be applied to other circuits in the chip. Some means is thus necessary to switch between the normal input transistor connected to the buried module wiring and the EC transistor switch connected to the external EC pad on the module surface.

Another application requiring circuit dotting in combination with a switching function is a decoder circuit.

A universal logic requirement often imposed on both of these circuit applications is that the resulting circuits simultaneously provide both true and complement outputs. This logic requirement is especially important in collector-switched-emitter-follower (CSEF) circuits, where both true and complementary outputs are normally available. The use of an extra inverter stage in such applications to obtain a complementary output is generally considered to be unacceptable due to the delay which such a stage adds to the circuit speed.

There are a variety of different emitter dotting circuits and collector dotting circuits available in the art for various applications. However, conventional emitter dotting circuits can only provide the complement (out-of-phase) output. Likewise, conventional collector dotting circuits can only provide the true (in-phase) output. Additionally, the dotting of the collectors of two input transistors causes current doubling in the collector resistors when both transistors are biased into conduction. Such current doubling drives the collector voltage of the respective input transistors to a value below their respective base voltages, thereby causing the transistors to saturate. Such saturated transistors have significantly slower switching speeds compared to unsaturated transistor switching speeds. To prevent this transistor saturation, voltage clamps are generally connected across the collector resistors. However, the voltage clamps (typically a diode) act as loads on their collectors and thus slow down the transistor switching speeds.

The invention as claimed is intended to remedy the above-described limitations with conventional dotting circuits. An advantage offered by the present invention is that input transistor switching is obtained in combination with transistor circuit dotting, while simultaneously providing both true and complementary output values from the circuit. A further advantage offered by the present invention is that current in the collector/drain resistors of the input and reference transistors therein is unaffected by the dotting, so that a voltage clamp circuit is unnecessary. Accordingly, the transistor switching delay attendant to the use of voltage clamp circuits is obviated.

SUMMARY OF THE INVENTION

Briefly the present invention comprises a dotting circuit for switching applications which provides true and complementary outputs simultaneously with minimum delay, comprising:
  a voltage source;
  a first input switch with a first and second ends, and a control input connected to a first input line;
  a second input switch with a first and second ends, and a control input connected to a second input line;
  a first resistance means connected between the voltage source and the first ends of the first and second input switches for generating a voltage drop when current passes therethrough;
  means connected to the first ends of the first and second input switches for obtaining a complement output voltage therefrom;
  a first reference switch with a first and second ends and a control input;
  a second reference switch with a first and second ends and a control input;
  second resistance means connected between the voltage source and the first ends of the first and second reference switches for generating a voltage drop when current passes therethrough;
  means connected to the first ends of the first and second reference switches for obtaining a true output voltage therefrom;
  current source means for providing an approximately constant current;
  first control means for connecting the current source to the second ends of the first input switch and the first reference switch, and including a first control input for receiving a first logic signal for permitting or inhibiting the first control means from providing current to the first input switch and the first reference switch; and
  second control means for normally connecting the current source means to the second ends of the second input switch and the second reference switch, and including means for inhibiting the provision of current to the second input switch and the second reference switch if, and only if, the first control means is providing current to the first input switch and the first reference switch.

In a preferred embodiment, the above-described switches and control means may comprise transistors. Additionally, the circuit may include at least one double-emitter/source third input transistor, with its collector/drain connected to the first ends of the first and second transistor switches, and with one emitter/source connected to the second ends of the first input transistor switch and the first reference transistor switch, and with the other emitter/source thereof connected to the second ends of the second transistor input switch and the second reference transistor switch.

In one embodiment, the first control means may comprise a transistor with its collector/drain connected to the second ends of the first input switch and the first reference switch, with its emitter/source connected to the current source, and with its base/gate connected for receiving the first logic signal. Additionally, the second control means may comprise a transistor with its collector/drain connected to the second ends of the second input switch and the second reference switch, with its emitter/source connected to the current source, and with its base/gate connected for receiving a second logic signal for inhibiting the provision of current to the second input switch and a second reference switch if, and only if, the first control means is providing current to the first input switch and the first reference switch.

In a preferred embodiment, the current source means may comprise a first current source with its output connected to apply current to the emitters/sources of the first input transistor switch and the first reference transistor switch; and a second current source circuit with its output connected to apply current to the emitters/sources of the second input transistor switch and the second reference transistor switch. The first control means may then comprise a first diverting transistor with its emitter/source connected to the output of the first current source circuit, with its collector/drain connected to a voltage source, and with its base/gate connected to receive the first logic signal. Likewise the second control means may comprise a second diverting transistor with its emitter/source connected to the output of the second current source circuit, with its collector/drain connected to a voltage source, and with its base/gate connected to receive a second logic signal which is the complement of the first logic signal. Additionally, in this preferred embodiment the true and complement output voltage-obtaining means may comprise emitter/source follower circuits.

BRIEF DESCRIPTION OF THE DRAWINGS

The FIGURE comprises a schematic diagram of a preferred embodiment of the present invention.

DETAILED DESCRIPTION OF THE PREFERRED EMBODIMENT

The present invention comprises a new dotting circuit for integrated circuit chips, which circuit provides line switching, as well as true and complementary outputs, while eliminating the need for the standard collector/drain circuit voltage clamp. This circuit is implemented by the collector/drain dotting of two or more input transistors, the collector dotting of their respective reference transistors, the emitter/source dotting of one input transistor and a reference transistor to a constant current source, the emitter/source dotting of the other input transistor and the other reference transistor to a different constant current source, and an inhibit circuit for permitting current to flow to only one of the emitter/source-dotted circuits in accordance with a logic control signal.

Referring now to the FIGURE, there is shown a preferred embodiment of the present invention. This embodiment comprises a voltage source 10, a first input switch 12 having a first end 14 and a second end 16, and a control input 18 connected to a first input line. Typically, this control input 18 is connected to an I/O terminal which is on the module external to the chip and leads to buried wiring in the module.

The circuit further comprises a second input switch 22 with a first end 24, a second end 26, and a control input 28 connected to a second input line. Typically, this control input for the second input switch 22 is connected to another I/O terminal which is on the module external to the chip. By way of example, this control input 28 could be connected to an EC pad disposed on the module external to the chip. The circuit further comprises a first resistance means connected between the voltage source 10 and the first ends 14 and 24 of the first and second input switches 12 and 22. This first resistance means is for generating a voltage drop when current passes therethrough. The first resistance means can be implemented by means of a variety of different circuit configurations, as is well known in the circuit art. In the embodiment shown in the FIGURE, the first resistance means is comprised of the resistors 30 and 32 connected in series between the voltage source 10 and the first ends 14 and 24 ot the first and second switches 12 and 22.

The circuit further comprises means 36 connected to the first ends 14 and 24 of the first and second input switches 12 and 22 for obtaining a complement output voltage therefrom. By way of example, this means 36 may comprise simply the line 38 connected to the first ends 14 and 24 of those switches. In a preferred embodiment, this means 36 is implemented by means of a standard voltage shifter circuit to obtain the complement output. Such voltage shifter circuits are typically used for replicating input voltage values, as required by standard logic convention. In the circuit shown in the FIGURE, the voltage shifter 36 is formed by a transistor 40 connected in an emitter follower configuration through a resistor 42 to a voltage source 44. The complement output is taken from the emitter output 46. Such emitter-follower circuits permit much higher current flow therein without impacting the main receiving circuit shown in the FIGURE.

The circuit further comprises a first reference switch 52 with a first end 54, a second end 55, and a control input 58. A second reference switch is also provided with a first and second ends and a control input. The first and second reference switches may be implemented by separate switch circuits. In the embodiment shown in the FIGURE, the first and second reference switches are implemented by a single double switch circuit with a common first end 54, a common control input 58, and a second end 55 for the first reference switch, and a second end 56 for the second reference switch. Typically, the control input 58 is connected to a convenient reference voltage value, such as ground voltage.

The circuit in the FIGURE further comprises a second resistance means connected between the voltage source 10 and the first ends 54 of the first and second reference switches 52 for generating a voltage drop when current passes therethrough. In the circuit embodiment shown in the FIGURE, the second resistance means may comprise the series connected resistors 30 and 34 connected between the voltage source 10 and the first ends 54 for the reference switches 52.

The circuit further comprises means 60 connected to the first ends 54 of the first and second reference switches 52 for obtaining a true output voltage value therefrom. As noted previously, this means 60 may be implemented simply by the line 62. In a preferred embodiment, this means 60 is implemented by a voltage shifter circuit 64 in the form of an emitter follower. This emitter follower circuit may comprise the transistor 64 connected through a resistor 66 to a voltage source 68. The true output is then taken from the emitter output line 65.

The circuit further comprises a current source 70 for providing an approximately constant current. Additionally, the circuit comprises first control means 72 for connecting the current source 70 to the second ends 16 and 55 of the first input switch 12 and the first reference switch, respectively. This first control means 72 includes a first control input 74 for receiving a first logic signal for either permitting or inhibiting the first control means 72 from providing current to the first input switch 12 and the second end 55 of the first reference switch. Likewise, the circuit includes a second control means 76 for normally connecting the current source means 70 to the second ends 26 and 56 of the second input switch 22 and the second reference switch, respectively. This second control means 76 further includes means for inhibiting the provision of current to the second input switch 22 and the second end 56 of the second reference switch if, and only if, the first control means 72 is providing current to the first input switch 12 and the second end 55 of the first reference switch.

In one embodiment of the present invention, the first control means may comprise a first control switch with a first and second ends and a control input. The first end of the first control switch may be connected to the second ends 16 and 55 of the first input switch 12 and the first reference switch, respectively, and with its second end connected to the current source means 70. The control input for the first control switch is connected for receiving the first logic signal. Likewise, the second control means 76 may comprise a second control switch with a first and second ends and a first control input. The first end thereof may be connected to the second ends 26 and 56 of the second input switch 22 and the second reference switch, respectively. The second end of the second control switch may be connected to the current source. The first control input thereof is connected for receiving the second logic signal for inhibiting the provision of current to the second input switch 22 and the second end 56 of the second reference switch if, and only if, the first control means 72 is providing current to the first input switch 12 and the second end 55 of the first reference switch.

In a preferred embodiment, the current source means 70 may comprise a first current source 90 with its output connected to apply current to the second ends 16 and 55 of the first input switch 12 and the first reference switch, respectively. The current source means 70 may further comprise a second current source 100 with its output connected to apply current to the second ends 26 and 56 of the second input switch 22 and the second reference switch, respectively. In this embodiment, the first control means 72 may comprise a first means 112 for diverting current from the first current source 90 away from the first input switch 12 and the first reference switch 52 in accordance with the first logic signal. Likewise, the second control means 78 may comprise second means 122 for diverting current from the second current source 100 away from the second input switch 22 and the second end 56 of the second reference switch in accordance with the second logic signal.

The first and second input switches 12 and 22, the first and second reference switches 52, and the first and second control means 72 and 76 may be implemented by means of a number of different switching circuit configurations utilizing a number of different semiconductor switching devices. In one embodiment, the above-listed switches and control means may be implemented by field effect transistors. In the embodiment shown in the FIGURE, the input and reference switches, the voltage shifter circuits, and the first and second control means are implemented by means of bipolar transistors. In the FIGURE, the bipolar transistors utilized are NPN transistors. However, it is understood that PNP transistors could have been utilized just as easily. With the bipolar transistor implementation shown in the FIGURE, the first end of each of the switches comprises a transistor collector, while the second end of each of the switches comprises a transistor emitter, and the control input of each of the switches comprises a transistor base.

Thus, in the example embodiment shown in the FIGURE, the first input switch 12 and the second input switch 22 each comprise transistors with their collector ends 14 and 24 connected to the first resistance means by means of a connection to the resistor 32. Likewise, the first and second reference switches 52 are implemented by a double-emitter transistor 52 with an emitter 55 for the first reference transistor and an emitter 56 for the second reference transistor. The collector end 54 for this double-emitter transistor 52 is connected to the second resistance means by means of a connection to the resistor 34.

Likewise, the switch 40 for implementing means 36 for obtaining the complementary output voltage is simply implemented by a transistor in a standard emitter-follower configuration. Likewise, the switch 64 for implementing means 60 for providing the true output voltage therefrom may be implemented simply by a transistor in the standard emitter-follower circuit configuration.

In the embodiment shown in the FIGURE, current source means 70 comprises a first and a second current sources. The first current source is implemented by a transistor 90 with its collector connected to apply current to the second ends 16 and 55 of the first input transistor 12 and the first reference transistor. The emitter output for this transistor 90 is connected through a standard constant current source resistor 92 to a voltage source 94. Likewise, the second current source comprises a transistor 100 with its collector connected to the second ends 26 and 56 of the second input transistor 22 and the second reference transistor, respectively. The emitter output end of the transistor 100 is connected through a standard constant current source resistor 102 to the voltage source 94. Both transistors 90 and 100 are connected at their bases 96 and 106 to standard biasing voltages $V_x$. In a preferred embodiment, the biasing voltages $V_x$ are set at a value sufficient to maintain the transistors 90 and 100 in constant conduction.

In the embodiment shown in the FIGURE, the first control means 72 comprises first means for diverting current from the first current source transistor 90 away from the first input switch 12 and the first reference switch emitter 55 in accordance with the first logic signal. In the embodiment shown, this first diverting current comprises a transistor 112 with its collector end 114 connected to a voltage source 120, with its emitter end 116 connected to the collector output of the first current source transistor 90, and with its base 74 connected to receive the first logic signal. Likewise, the second control means 76 is shown in the FIGURE to comprise second means for diverting current from the second current source 100 away from the second input switch 22 and the second reference switch emitter 56 in accordance with a second logic signal. This second diverting means is shown in the FIGURE to comprise a transistor 122 with its collector end 124 connected to a voltage source, with its emitter end 126 connected to the collector output of the second current source transistor 100, and with its base end 80 connected to receive the second logic signal. In a preferred embodiment, this second logic signal is the complement of the first logic signal. Additionally, it is preferred that both collector ends 114 and 124 be connected to the same voltage source 120. In the FIGURE, this voltage source 120 is conveniently designed to be the same as the voltage source 10.

In view of the above, it can be seen that the present circuit is specially designed to provide line switching between the first input transistor 12 and the second input transistor 22, while providing true and complementary outputs simultaneously. The collectors of these input transistors are dotted, but they are fed from two different current lines which are controlled so that only one of these two input transistors is receiving current at any given time. Accordingly, the collector dotting of these two transistor switches does not double the current in the collector resistors when both inputs 18 and 28 of these transistors are in their logical "1" or positive states simultaneously. Thus, no DC clamps are necessary for this collector dotting circuit.

The present circuit operates as follows. In order to propagate the signal on the input line connected to the base terminal 18 of the first input transistor 12 to the emitter-follower outputs 46 and 65, the first logic signal applied to the base terminal 74 for the first control transistor 112 is maintained at a low voltage, e.g., −0.7 v. With this low voltage first logic signal at the base line 74, the transistor 112 is maintained in a non-conductive state. Accordingly, when the signal on line 18 is high, the first input transistor 12 is conductive and current flows in a circuit path through the resistor 30, the resistor 32, through the transistor 12 from the collector end thereof to the emitter line 16, through the normally conducting first current source transistor 90, to the voltage source 94. The voltage drop caused by the flow of current through the first resistance means composed of the resistor 30 and the resistor 32 causes a low voltage to occur on the dotted collector line 38. By way of example, this voltage might be 0.4 v. Due to the nominal voltage drop of 0.8 v across the base and emitter terminals of the emitter follower transistor 40, the voltage on the emitter follower output line 46 is −0.4 v. Accordingly, it can be seen that a high logic "1" voltage on the base input 18 of the first input transistor 12 causes the emitter follower output on line 46 to be low, or a logic "0". Accordingly, this output on line 46 is the complementary output for the circuit.

As noted previously, the base terminal 58 for the double-emitter reference transistor 52 is connected to a convenient reference voltage, such as ground voltage. Also, the voltage on the common emitter line 17 is determined by the most positive base voltage of all of the transistors whose emitters are connected to that line. When the voltage at the base input 18 of transistor 12 is +0.4 v, then the voltage on line 17 is −0.4 v due to the base-to-emitter voltage drop of +0.8 v across transistor 12. Thus, the voltage at the emitter 55 of transistor 52 is −0.4 v, and there is only an 0.4 v drop between the base and the emitter of transistor 52. Accordingly, transistor 52 does not conduct when the first input transistor 12 is conducting. Thus, because no current is flowing in the resistor 34, the voltage at the collector output terminal 54 for the transistor 52 takes the voltage at point 31. By way of example, this voltage might be 1.2 v. This voltage at the collector output 54 would then be converted via the emitter follower voltage drop of 0.8 v between the base and the emitter of the transistor 64 to a voltage of 0.4 v on the line 65. This voltage may then be viewed as a logic "1" voltage. Accordingly, the output on line 65 is termed the true output.

If the voltage on the base input 18 for the first input transistor 12 is at a logic "0", then the first input transistor 12 is non-conductive and the voltage on the emitter line 17 connecting the emitters 16 and 55 to the first current source transistor 90 drops to −0.8 v. This drop in the emitter line 17 voltage thus causes a voltage drop between the grounded base terminal 58 of the reference transistor 52 and the emitter terminal 55 thereof, thereby causing the double-emitter reference transistor 52 to conduct current through its emitter 55. With current now being drawn through the resistor 34 of the second resistance means, the voltage at the collector terminal 54 for the reference transistor 52 drops to 0.4 v. This 0.4 v voltage is then converted by the emitter follower circuits 60 to a −0.4 v voltage on the emitter follower output line 65. Likewise, with no current flowing through the resistor 32 of the first resistance means, the voltage on the common collector line 38 rises to the voltage at the point 31, i.e., 1.2 v. The emitter follower circuit 36 then converts this 1.2 v voltage to 0.4 v at the emitter follower output line 46.

If it is now desired to take inputs from the second input line connected to the base 28 of the second input transistor 22, then the first logic signal applied to the base terminal 74 for the transistor 112 of the first control means 72 is preferably made more positive than the logic "1" signal being applied on base input lines 18 and 28. In turn, the second logic signal applied to the base terminal 80 of the transistor 122 of the second control means 76 is made more negative than the logic "0" signal applied to the base terminals 18 and 28. Typically, the logic "1" and the logic "0" take the values of +0.4 v and −0.4 v. Accordingly, an appropriate logic signal which is higher than the standard logic "1" might be 0.6 v, while an appropriate logic signal below the logic "0" value might be −0.6 v. The higher voltage at the base terminal 74 for the first control transistor 112 ensures that current flowing through the first current source transistor 90 is diverted through the transistor 112 to the voltage source 120, and that no current flows on the common emitter line 17. Likewise, the very low voltage on the base terminal 80 for the second control transistor 122 ensures that that transistor is non-conductive so that current from the second current source transistor 100 flows to the common emitter line 27 and to the emitter terminal 26 of the second input transistor 22 and the emitter terminal 56 of the second reference transistor. The second input transistor-second reference transistor pair operate in the same way as the first input transistor-first reference transistor pair. When the input voltage at the base terminal 28 is at a logic "1" value, then the second input transistor 22 is conductive and draws current through the resistor 32 of the first resistance means. Accordingly, the voltage on the common collector line 38 is approximately 0.4 v. The common emitter circuit 36 then converts this voltage to the complement voltage of −0.4 v on the common emitter output line 46. Likewise, since no current is flowing through the resistor 34 of the second resistor means, the voltage at the collector terminal 54 for the second reference transistor takes the value at point 31, i.e., 1.2 v. The common emitter transistor 64 then operates to convert this voltage to a true value of 0.4 v on the common emitter output line 65. When the voltage at the base terminal 28 of the second input transistor is at a logic "0" value, then the second input transistor 22 is non-conductive, and the voltage on the common emitter line 27 connecting the emitters 26 and 56 drops to approximately −0.8 v. This drop in voltage on the emitter line 27 causes current to be drawn by the second reference transistor through its emitter terminal 56. Since current is now flowing through the resistor 34 of the second resistor means, the voltage at the collector terminal 54 for the second reference transistor drops to 0.4 v. This 0.4 v value is then converted by the common emitter transistor 64 to a true value of −0.4 v on the common emitter output line 65.

It should be noted that a variety of additional circuit switches may be collector dotted to the common collector line 38. In the FIGURE, additional switches 130, 132, and 134 are shown with their collectors dotted to the common collector line 38. These switches 130, 132, and 134 are conveniently implemented by NPN transistors with dual-emitters. One emitter for each of these additional transistors is connected to the common emitter line 17 which connects to the first current source transistor 90. The second emitter for each of these additional transistors is connected to the common emitter line 27 which connects to the second current source transistor 100. Since one of either the first current source transistor 90 or the second current source transistor 100 is always conducting, current is always available to flow to these additional transistors 130, 132, and 134 if their bases are in a logical "1" state. Accordingly, a switching action may take place between the first input transistor 12 and the second input transistor 22, without affecting the operation of these transistors 130, 132, and 134. These transistors are typically designed to take inputs at their base terminals which come from lines internal to the chip. Note that regardless of how many additional switches are collector dotted to the common collector line 38, the current drawn through the resistor 30 and either the resistor 32 or the resistor 34 is always constant. This current is dictated by the base-emitter voltage drop across the first and second current source transistors 90 and 100. So long as the voltage at the base terminal 96 for the transistor 90 is held constant, and the voltage at the base terminal 106 for the transistor 100 is held constant, then the current through these two transistors is approximately constant, regardless of which of the transistors 12, 22, 130, 132, 134 or 52 is conductive.

As noted previously, current source means 70 and the first and second control means 72 and 76 may be implemented in a number of other circuit configurations. For example, the transistors 112 and 122 could be removed and the transistors 90 and 100 could be utilized as the first and second control means. With this circuit design, the first logic signal would then be applied to the base terminal 96 of the transistor 90, while the second logic signal would be applied to the based terminal 106 for the transistor 100. These first and second logic signals would again be complements of each other to ensure that when one of the transistors 90 or 100 was conductive, that the other transistor was non-conductive. The current source means 70 could then be implemented simply by disposing an additional transistor with an emitter resistor in the common line 93 connecting to the voltage source 94. The collector of this additional transistor would be connected to the common terminal of the resistors 92 and 102, while the emitter resistor of this transistor would be connected to the voltage source 94. Also, resistors 92 and 102 can now be replaced with metal lines. Alternately, the well known "current mirror" circuit configuration may be used as a constant current source.

The present invention sets forth a new dotting circuit for integrated circuit chips which provides line switching, as well as simultaneous true and complementary outputs. Accordingly, this circuit has universal application. This circuit also eliminates the need for the standard collector circuit voltage clamps because the current in the collector resistors does not double, regardless of how many of the circuit switches are conducting. Thus, the delays attendant to the use of such voltage clamps is eliminated. This circuit can be implemented with standard logic gate cells and thus has no adverse impact on chip design.

While the present invention has been particularly shown and described with reference to preferred embodiments therefor, it will be understood by those skilled in the art that the foregoing and other changes in form and detail may be made therein without departing from the spirit and scope of the present invention.

We claim:

1. A dotting circuit for switching applications which provides true and complementary outputs simultaneously, comprising:
   a voltage source;
   a first input switch with a first and second ends and a control input connected to a first input line;
   a second input switch with a first and second ends, and a control input connected to a second input line;
   first resistance means connected between said voltage source and the first ends of said first and second input switches for generating a voltage drop when current passes therethrough;
   means connected to said said first ends of said first and second input switches for obtaining a complement output voltage therefrom;
   a first reference switch with a first and second ends and a control input;
   a second reference switch with a first and second ends and a control input;
   second resistance means connected between said voltage source and the first ends of said first and second reference switches for generating a voltage drop when current passes therethrough;
   means connected to said first ends of said first and second reference switches for obtaining a true output voltage therefrom;
   current source means for providing an approximately constant current;
   first control means for connecting said current source means to the second ends of said first input switch and said first reference switch, and including a first control input for receiving a first logic signal for permitting or inhibiting said first control means from providing current to said first input switch and said first reference switch; and
   second control means for normally connecting said current source means to the second ends of said second input switch and said second reference switch, and including means for inhibiting the provision of current to said second input switch and said second reference switch if, and only if, said first control means is providing current to said first input switch and said first reference switch,
wherein said switches and said control means are comprised of transistors; and
further comprising at least one third input transistor with a first end and a double second end, with its first end connected to the first ends of said first and second input switches, and with one second end thereof connected to the second ends of said first input switch and said first reference switch, and with the other second end thereof connected to the second ends of said second input switch and said second reference switch.

2. A circuit as defined in claim 1, wherein said first control means comprises a first control switch with first and second ends and said first control input, wherein said first end is connected to said second ends of said first input switch and said first reference switch, wherein said second end is connected to said current source, and wherein said first control input is connected for receiving said first logic signal; and
wherein said second control means comprises a second control switch with a first and second ends and a second control input, with said first end connected to said second ends of said second input switch and said second reference switch, with said second end connected to said current source, and with said second control input connected for receiving a second logic signal for inhibiting the provision of current to said second input switch and said second reference switch if, and only if, said first control means is providing current to said first input switch and said first reference switch.

3. A circuit as defined in claim 1, wherein said current source means comprises a first current source with its output connected to apply current to the second ends of said first input switch and said first reference switch; and a second current source with its output connected to apply current to the second ends of said second input switch and said second reference switch;
wherein said first control means comprises first means for diverting current from said first current source away from said first input switch and said first reference switch in accordance with said first logic signal; and
wherein said second control means comprises second means for diverting current from said second current source away from said second input switch and said second reference switch in accordance with a second logic signal.

4. A circuit as defined in claim 1, wherein said switches and said control means include bipolar transistors, with said first end of said switches being a transistor collector, with said second end of said switches being a transistor emitter, and with said control input of said switches being a transistor base.

5. A circuit as defined in claim 4, wherein said true output means and said complement output means comprise emitter follower circuits.

6. A circuit as defined in claim 4, wherein said true output means and said complement output means comprise true and complement output lines.

7. A circuit as defined in claim 5, wherein said first control means comprises a transistor with its collector connected to said second ends of said first input switch and said first reference switch, with its emitter connected to said current source, and with its base connected for receiving said first logic signal; and
wherein said second control means comprises a transistor with its collector connected to said second ends of said second input switch and said second reference switch, with its emitter connected to said current source, and with its base connected for receiving a second logic signal for inhibiting the provision of current to said second input switch and said second reference switch if, and only if, said first control means is providing current to said first input switch and said tirst reference switch.

8. A circuit as defined in claim 5, wherein said current source means comprises a first current source with its output connected to apply current to the second ends of said first input switch and said first reference switch; and a second current source with its output connected to apply current to the second ends of said second input switch and said second reference switch;
wherein said first control means comprises first means for diverting current from said first current source away from said first input switch and said first reference switch in accordance with said first logic signal; and
wherein said second control means comprises second means for diverting current from said second current source away from said second input switch and said second reference switch in accordance with a second logic signal.

9. A circuit as defined in claim 8, wherein said first diverting means comprises a transistor with its emitter connected to the output of said first current source, with its collector connected to a voltage source, and with its base connected to receive said first logic signal; and
wherein said second diverting means comprises a transistor with its emitter connected to the output of said second current source, with its collector connected to a voltage source, and with its base connected to receive said second logic signal, which is the complement of said first logic signal.

10. A circuit as defined in claim 9, wherein said first and second reference switches comprise a double-emitter transistor circuit, with one emitter connected to said second end of said first input transistor, and with the other emitter thereof connected to the second end of said second input transistor.

11. A circuit as defined in claim 9, wherein each of said first and second current sources comprises a transistor which is biased into conduction.

12. A circuit as defined in claim 1, wherein said switches and said control means include field effect transistors, with said first end of said switches being a transistor drain, with said second end of said switches being a transistor source, and with said control input being a transistor gate.

13. A circuit as defined in claim 12, wherein said true output means and said complement output means comprise voltage shifting circuits.

14. A circuit as defined in claim 12, wherein said true output mcans and said complement output means comprise true and complement output lines.

15. A circuit as defined in claim 13, wherein said first control means comprises a transistor with its drain connected to said second ends of said first input switch and said first reference switch, with its source connected to said current source, and with its gate connected for receiving said first logic signal; and wherein said second control means comprises a transistor with its drain connected to said second ends of said second input switch and said second reference switch, with its source connected to said current source, and with its gate connected for receiving a second logic signal for inhibiting the provision of current to said second input switch and said second reference switch if, and only if, said first control means is providing current to said first input switch and said first reference switch.

16. A circuit as defined in claim 13, wherein said current source means comprise a first current source with its output connected to apply current to the second ends of said first input switch and said first reference switch; and a second current source with its output connected to apply current to the second ends of said second input switch and said second reference switch;

wherein said first control means comprises first means for diverting current from said first current source away from said first input switch and said first reference switch in accordance with said first logic signal; and wherein said second control means comprises second means for diverting current from said second current source away from said second input switch and said second reference switch in accordance with a second logic signal.

17. A circuit as defined in claim 16, wherein said first diverting means comprises a transistor with its source connected to the output of said first current source, with its drain connected to a voltage source, and with its gate connected to receive said first logic signal; and wherein said second diverting means comprises a transistor with its source connected to the output of said second current source, with its drain connected to a voltage source; and with its gate connected to receive said second logic signal, which is the complement of said first logic signal.

18. A collector dotting circuit which provides true and complementary outputs simultaneously comprising:

a voltage source;

a first input transistor with a collector, emitter and base, wherein said base is connected to a first input line;

a second input transistor with a collector, emitter, and base, wherein said base is connected to a second input line, and wherein said collector is connected to the collector of said first input transistor;

at least one double-emitter third input transistor with a collector, emitter, and base, wherein said base is connected to a third input line;

first resistance means connected between said voltage source and the collectors of said first, said second, and said at least one double-emitter third input transistors for generating a voltage drop when current passes therethrough;

a first emitter follower circuit connected to the collectors of said first and second input transistors for obtaining a complement output voltage therefrom;

a first reference transistor with a collector, emitter, and base;

a second reference transistor with a collector, emitter, and base;

second resistance means connected between said voltage source and the collectors of said first and second reference transistors for generating a voltage drop when current passes therethrough;

a second emitter follower circuit connected to the collectors of said first and second reference transistors for obtaining a true output voltage therefrom;

a current source for providing an approximately constant current, said current source comprising a first current source circuit with its output connected to apply current to the emitters of said first input transistor, said first reference transistor, and to one emitter of said at least one double-emitter third input transistor, and a second current source circuit with its output connected to apply current to the emitters of said second input transistor and said second reference transistor, and to the other emitter of said at least one double-emitter third input transistor;

first control means, including a first diverting transistor with its emitter connected to the output of said first current source circuit, with its collector connected to said voltage source, and with its base connected to receive a first logic signal, for permitting or diverting current to flow from said first current source circuit to the emitters of said first input transistor, said first reference transistor, and to said one emitter of said at least one double-emitter third input transistor; and second control means, including a second diverting transistor with its emitter connected to the output of said second current source circuit, with its collector connected to said voltage source, and with its base connected to receive a second logic signal which is the complement of said first logic signal, for inhibiting provision of current from said second current source to the emitters of said second input transistor, said second reference transistor, and to said other emitter of said at least one double-emitter third input transistor if, and only if, said first control means is providing current to said first input transistor and said first reference transistor.

19. A circuit as defined in claim 18, wherein said first and second reference transistors comprise a double-emitter transistor circuit, with one emitter thereof connected to the emitter of said second input transistor, and with the other emitter thereof connected to the emitter of said second input transistor.

* * * * *